United States Patent
Kondoh et al.

(10) Patent No.: US 9,818,731 B2
(45) Date of Patent: Nov. 14, 2017

(54) LIGHT EMITTING DEVICE

(71) Applicant: SHARP KABUSHIKI KAISHA, Sakai, Osaka (JP)

(72) Inventors: Masaki Kondoh, Sakai (JP); Tomokazu Nada, Sakai (JP); Toshio Hata, Sakai (JP); Hideshi Koizumi, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 0 days.

(21) Appl. No.: 15/307,597

(22) PCT Filed: Apr. 14, 2015

(86) PCT No.: PCT/JP2015/061454
§ 371 (c)(1),
(2) Date: Oct. 28, 2016

(87) PCT Pub. No.: WO2015/182272
PCT Pub. Date: Dec. 3, 2015

(65) Prior Publication Data
US 2017/0047311 A1     Feb. 16, 2017

(30) Foreign Application Priority Data
May 30, 2014   (JP) .................... 2014-113457

(51) Int. Cl.
H01L 33/00      (2010.01)
H01L 25/075     (2006.01)
H01L 33/56      (2010.01)
(Continued)

(52) U.S. Cl.
CPC .......... H01L 25/0753 (2013.01); H01L 33/56 (2013.01); H01L 33/60 (2013.01);
(Continued)

(58) Field of Classification Search
CPC ..... H01L 25/0753; H01L 33/60; H01L 33/62; H01L 33/56
(Continued)

(56) References Cited

U.S. PATENT DOCUMENTS

2008/0036943 A1   2/2008  Matsumoto et al.
2008/0259252 A1  10/2008  Tanaka et al.

FOREIGN PATENT DOCUMENTS

JP     7-175423     7/1995
JP     8-272316    10/1996
(Continued)

OTHER PUBLICATIONS

Machine translation of PCT/JP2015/061454 wrtten opinion of an International searching Authority dated Jun. 2015.*
(Continued)

*Primary Examiner* — David S Blum
(74) *Attorney, Agent, or Firm* — Steven Reiss

(57) ABSTRACT

The color purities of blue-green light and yellow or yellow-green light are enhanced. A light emitting device (100) configured to emit at least blue-green light and yellow or yellow-green light includes a substrate (51), an LED chip group, and a sealing resin part (50) collectively sealing the LED chip group, wherein the LED chip group at least includes a green LED chip (GB), a green LED chip (GY), a blue LED chip (B), and a red LED chip (R), and the green LED chip (GB) has a dominant wavelength shorter than a dominant wavelength of the green LED chip (GY).

5 Claims, 13 Drawing Sheets

(51) Int. Cl.
*H01L 33/60* (2010.01)
*H01L 33/62* (2010.01)

(52) U.S. Cl.
CPC .... *H01L 33/62* (2013.01); *H01L 2224/48091* (2013.01); *H01L 2224/48247* (2013.01); *H01L 2224/48257* (2013.01); *H01L 2224/49113* (2013.01)

(58) Field of Classification Search
USPC .......................................................... 257/89
See application file for complete search history.

(56) References Cited

FOREIGN PATENT DOCUMENTS

| JP | 10-136159 | 5/1998 |
|----|-----------|--------|
| JP | 10-161567 | 6/1998 |
| JP | 2001-177156 | 6/2001 |
| JP | 2002-82635 | 3/2002 |
| JP | 2004-193357 | 7/2004 |
| JP | 2005-321727 | 11/2005 |
| JP | 2008-269947 | 11/2008 |
| JP | 2011-192738 | 9/2011 |
| JP | 2012-69572 | 4/2012 |

OTHER PUBLICATIONS

International Search Report for PCT/JP2015/061454 dated Jun. 16, 2015, 2 pages.
International Preliminary Report on Patentability (foreign language) dated May 12, 2016, 9 pages.

* cited by examiner

40: BONDING WIRE
51: SUBSTRATE
60: INNER LEAD PART
62: COMMON INNER LEAD PART
70: RESIN REFLECTOR
80: OPENING PART
90: OUTER LEAD PART
95: ANODE MARK
100: LIGHT EMITTING DEVICE
 B : BLUE LED CHIP
GB: GREEN LED CHIP
GY: GREEN LED CHIP
 R : RED LED CHIP

ONE LIGHT EMITTING PART
(ONE LIGHT EMITTING SURFACE)

50: SEALING RESIN PART
70: RESIN REFLECTOR
80: OPENING PART
90: OUTER LEAD PART
95: ANODE MARK
100: LIGHT EMITTING DEVICE

ONE LIGHT EMITTING PART
(ONE LIGHT EMITTING SURFACE)

50: SEALING RESIN PART
70: RESIN REFLECTOR
90: OUTER LEAD PART
95: ANODE MARK
100: LIGHT EMITTING DEVICE
B : BLUE LED CHIP
GB: GREEN LED CHIP
GY: GREEN LED CHIP
R : RED LED CHIP

40: BONDING WIRE
51: SUBSTRATE
60: INNER LEAD PART
62: COMMON INNER LEAD PART
70: RESIN REFLECTOR
80: OPENING PART
90: OUTER LEAD PART
95: ANODE MARK
200: LIGHT EMITTING DEVICE
 B : BLUE LED CHIP
BT: GREEN LED CHIP
GY: GREEN LED CHIP
 R : RED LED CHIP

40: BONDING WIRE
51: SUBSTRATE
60: INNER LEAD PART
62: COMMON INNER LEAD PART
70: RESIN REFLECTOR
80: OPENING PART
90: OUTER LEAD PART
95: ANODE MARK
300: LIGHT EMITTING DEVICE
 B : BLUE LED CHIP
 G : GREEN LED CHIP
GB: GREEN LED CHIP
GY: GREEN LED CHIP
 R : RED LED CHIP

40: BONDING WIRE
51: SUBSTRATE
60: INNER LEAD PART
62: COMMON INNER LEAD PART
70: RESIN REFLECTOR
80: OPENING PART
90: OUTER LEAD PART
95: ANODE MARK
350: LIGHT EMITTING DEVICE
 B : BLUE LED CHIP
 G : GREEN LED CHIP
GB: GREEN LED CHIP
GY: GREEN LED CHIP
 R : RED LED CHIP

40: BONDING WIRE
51: SUBSTRATE
65: INNER LEAD PART
67: COMMON INNER LEAD PART
70: RESIN REFLECTOR
80: OPENING PART
90, 96: OUTER LEAD PART
95: ANODE MARK
400: LIGHT EMITTING DEVICE
B : BLUE LED CHIP
GB: GREEN LED CHIP
GY: GREEN LED CHIP
R : RED LED CHIP

LIGHT EMITTING DEVICE

This application is the U.S. national phase of International Application No. PCT/JP2015/061454 filed 14 Apr. 2015 which designated the U.S. and claims priority to JP Patent Application No. 2014-113457 filed 30 May 2014, the entire contents of each of which are hereby incorporated by reference.

TECHNICAL FIELD

The present invention relates to a light emitting device including Light Emitting Diode (LED) chips.

BACKGROUND ART

PTL 1 discloses a light emission unit block for an image display apparatus configured to emit light of primary colors, which are red (R), green (G), and blue (B), the light emission unit block including a red light emitting diode element, a blue light emitting diode element, at least one yellow-green light emitting diode element, and at least one blue-green light emitting diode element, wherein the light emitting diode elements are arranged in proximity to one another.

Meanwhile, a multicolor light emitting device which is a member corresponding to one light emitting diode element according to PTL 1 but emits light of various colors and includes LED chips has been and is being developed. In particular, a light emitting device whose color reproduction range can be widely extended for decorative use or for use in lighting apparatuses has been and is being developed.

As an example of such a light emitting device, PTL 2 describes enhancement of the color reproducibility of a display device and discloses a light emitting module including a blue light emitting element, a green light emitting element, and a red light emitting fluorescent material in combination.

CITATION LIST

Patent Literature

PTL 1: Japanese Unexamined Patent Application Publication No. 10-161567 (published on Jun. 19, 1998)
PTL 2: Japanese Unexamined Patent Application Publication No. 2012-69572 (published on Apr. 5, 2012)

SUMMARY OF INVENTION

Technical Problem

A green LED chip of a light emitting device generally has a dominant wavelength range of 520 nm to 530 nm so as to realize both green color development at the time of monochromatic light emission and yellow color development by emission of red light and green light. However, the color purity of light emitted from this green LED chip is not so high. This causes a problem that the color purity of blue-green light obtained by emitting (mixing colors of) blue light and green light and the color purity of yellow or yellow-green light obtained by emitting (mixing colors of) red light and green light are not so high.

In view of the above problems, it is an object of the present invention to provide a light emitting device whose color purities of blue-green light and yellow or yellow-green light can be enhanced.

Solution to Problem

To solve the problems described above, a light emitting device according to one aspect of the present invention is a light emitting device configured to emit at least blue-green light and yellow or yellow-green light the light emitting device including: a substrate, an LED chip group disposed on a main surface side of the substrate and including a plurality of LED chips; and a sealing part collectively sealing the LED chip group, wherein the LED chip group includes at least two green LED chips including a first green LED chip and a second green LED chip, at least one blue LED chip, and at least one red LED chip, the first green LED chip has a dominant wavelength shorter than a dominant wavelength of the second green LED chip, the first green LED chip is disposed adjacently to at least one of the at least one blue LED chip, the second green LED chip is disposed adjacently to at least one of the at least one red LED chip, and when a vertical direction and a horizontal direction orthogonal to each other in a top view of the light emitting device are defined, (A) in a view in the vertical direction, directivity characteristics of the second green LED) chip and directivity characteristics of the red LED chip substantially match with each other, and directivity characteristics of the blue LED chip and directivity characteristics of the first green LED chip substantially match with each other, and (B) in a view in the horizontal direction, the directivity characteristics of the red LED chip and the directivity characteristics of the first green LED chip substantially match with each other, and the directivity characteristics of the second green LED chip and the directivity characteristics of the blue LED chip substantially match with each other, or (C) in a view in the vertical direction, directivity characteristics of mixed colors of the second green LED chip and the first green LED chip, the directivity characteristics of the red LED chip, and the directivity characteristics of the blue LED chip substantially match with one another, and (D) in a view in the horizontal direction, the directivity characteristics of the second green LED chip and the directivity characteristics of the first green LED chip substantially match with each other.

Advantageous Effects of Invention

According to the one aspect of the present invention, the color purities of blue-green light and yellow or yellow-green light can be enhanced.

DESCRIPTION OF EMBODIMENTS

Summary of Invention

A multicolor light emitting device is provided which can realize good color mixing and high color purity and whose color reproduction range can be widely extended with only a plurality of LED chips.

In a multicolor light emitting device including RGB LED chips, at least two green LED chips including a first green LED chip and a second green LED chip, a blue LED chip, and a red LED chip are mounted on one package, and the dominant wavelength of the first green LED chip is relatively shorter than the dominant wavelength of the second green LED chip. Moreover, the dominant wavelength of the first green LED chip is preferably greater than or equal to 480 nm and less than or equal to 520 nm, the dominant wavelength of the second green LED chip is preferably greater than or equal to 530 nm and less than or equal to 560 nm, the dominant wavelength of the blue LED chip is preferably greater than or equal to 460 nm and less than or equal to 480 nm, and the dominant wavelength of the red LED chip is preferably greater than or equal to 610 nm and less than or equal to 630 nm. However, when a yellow LED chip is also used, there may be a case where the dominant wavelength of the second green LED chip is greater than or equal to 520 nm and less than or equal to 560 nm. With this configuration, the color purities of blue-green light and yellow or yellow-green light can be enhanced, and therefore, a multicolor light emitting device with high color purity can be realized.

Further, mounting the blue LED chip and the first green LED chip adjacently to each other leads to a good blue-green color tone obtained by mixing colors. Moreover, mounting the red LED chip and the second green LED chip adjacently to each other leads to a good yellow or yellow-green color tone obtained by mixing colors.

The difference between the dominant wavelength of the green LED chip having the longest wavelength in the green range and the dominant wavelength of each of the other green LED chips is preferably greater than or equal to 20 nm.

Regarding xy chromaticity coordinates of a CIE chromaticity diagram, the difference between the x value of the green LED chip having the longest wavelength in the green range and the x value of each of the other green LED chips is preferably greater than or equal to 0.06.

First Embodiment

Figure 1:
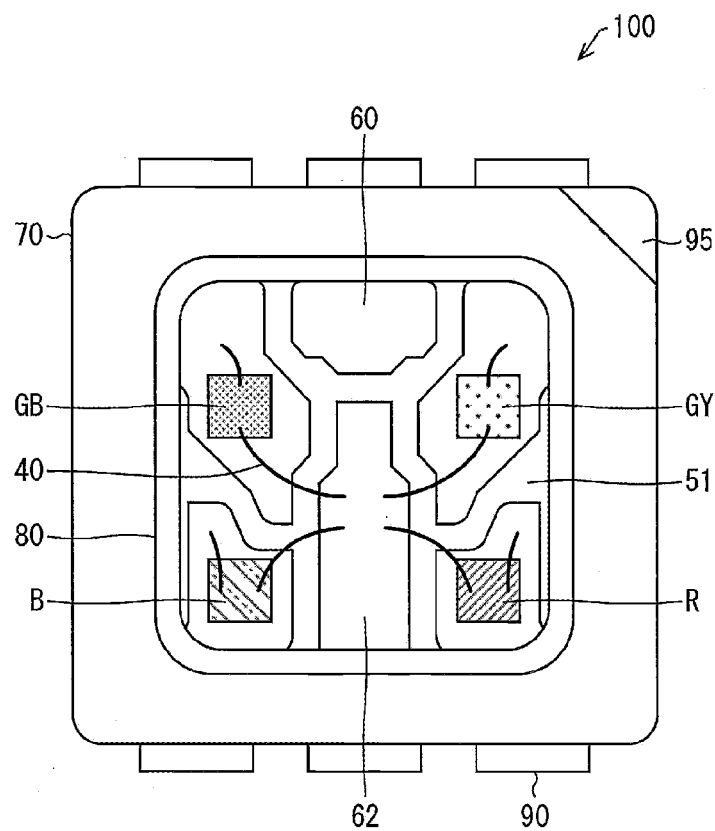
FIG. 1 is a top view illustrating a light emitting device according to a first embodiment of the present invention, wherein a sealing resin part is omitted.

FIG. 1 is a top view illustrating a light emitting device according to the present embodiment, wherein a sealing resin part is omitted.

Figure 2:
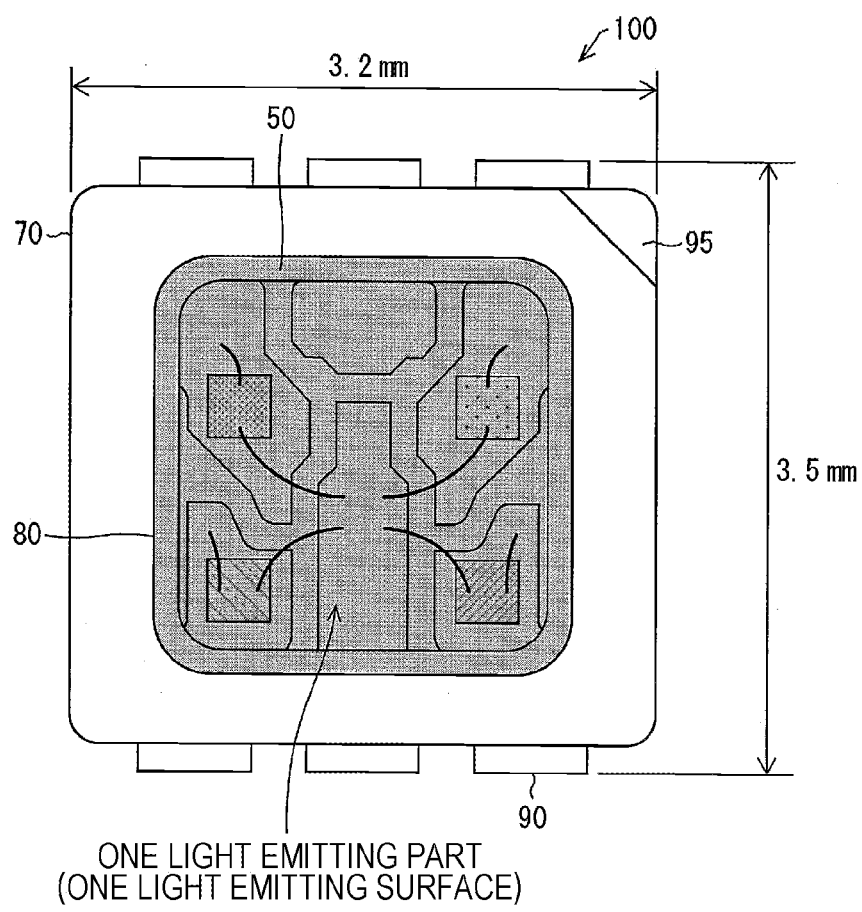
FIG. 2 is a top view illustrating the light emitting device according to the first embodiment of the present invention, wherein the sealing resin part is shown.

FIG. 2 is a top view illustrating the light emitting device according to the present invention, wherein the sealing resin part is shown.

Figure 3:
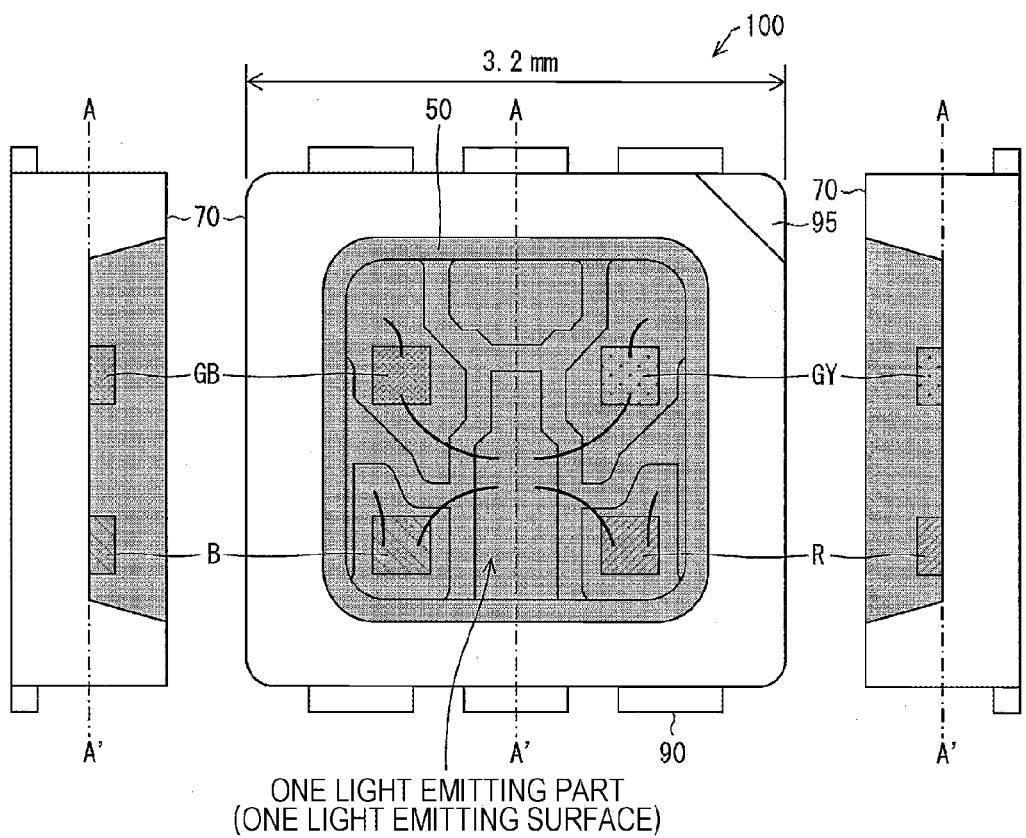
FIG. 3 is a view in which the top view of the light emitting device of FIG. 2 and a schematic sectional view of the main part of the light emitting device taken along line A-A' are shown in comparison.

FIG. 3 is a view in which the top view of the light emitting device of FIG. 2 and a schematic sectional view of the main part of the light emitting device taken along line A-A' are shown in comparison.

A light emitting device 100 illustrated in FIG. 1 to FIG. 3 is a multicolor light emitting device configured to emit at least blue-green light and yellow or yellow-green light.

The light emitting device 100 includes a resin reflector 70. The resin reflector 70 is configured to reflect light.

The light emitting device 100 further includes six outer lead parts 90 including outer leads for cathodes and outer leads for anodes, an inner lead part 60, a common inner lead part 62, an opening part 80, and an anode mark 95.

The light emitting device 100 further includes a green LED chip (first green LED chip) GB, a green LED chip (second green LED chip) GY, a blue LED chip B, a red LED chip R, a substrate 51, and a sealing resin part (sealing part) 50.

The green LED chip GB, the green LED chip GY, the blue LED chip B, and the red LED chip R form an LED chip group surrounded by the resin reflector 70. As illustrated in, for example, FIG. 3, the substrate 51 is a part of the resin reflector 70, and on its one surface side (a main surface side of the substrate 51), the green LED chip GB, the green LED chip GY, the blue LED chip B, and the red LED chip R are arranged. The green LED chip GB, the green LED chip GY, the blue LED chip B, and the red LED chip R are arranged to form a quadrangle (here, a rectangular shape), and in the light emitting device 100, the green LED chip GY, the red LED chip R, the blue LED chip B, and the green LED chip GB are arranged clockwise in this order. As illustrated in FIG. 2, the green LED chip GB, the green LED chip GY, the blue LED chip B, and the red LED chip R are collectively sealed with the one sealing resin part 50.

Specifically, the green LED chip GB, the green LED chip GY, the blue LED chip B, and the red LED chip R are arranged in the opening part 80. The inner lead part 60 and the common inner lead part 62 are also formed in the opening part 80.

The inner lead part 60 includes chip mount regions the number of which (five in FIG. 1, four in FIG. 8) is greater than or equal to the total number of the LED chips. The green LED chip GB, the green LED chip GY, the blue LED chip B, and the red LED chip R are connected to the same common inner lead part 62 and are each connected to a corresponding (different) one of the chip mount regions of the inner lead parts 60. These connections are realized by bonding wires 40. The chip mount regions of the inner lead part 60 and the common inner lead part 62 are each connected to one of the outer lead parts 90.

In a top view of the light emitting device 100, the dimension of the light emitting device 100 is 3.2 mm×3.5 mm.

Here, the dominant wavelength of the green LED chip GB is shorter than the dominant wavelength of the green LED chip GY. The dominant wavelength means a wavelength numerically representing the color shade when light emitted from a light emitting element such as an LED is viewed with human eyes.

More specifically, the dominant wavelength of the green LED chip GB is preferably greater than or equal to 480 nm and less than or equal to 520 nm, and the dominant wavelength of the green LED chip GY is preferably greater than or equal to 530 nm and less than or equal to 560 nm. For example, the dominant wavelength of the green LED chip GB may be 504 nm, and the dominant wavelength of the green LED chip GY may be 538 nm or 540 nm. In these cases, further, the dominant wavelength of the green LED chip GY having the longest dominant wavelength is longer than the dominant wavelength of each of the other green LED chips (here, only the green LED chip GB) by 20 nm or greater. Moreover, for example, the dominant wavelength of the blue LED chip B may be 465 nm. Moreover, for example, the dominant wavelength of the red LED chip R may be 626 nm.

The green LED chip GB, the green LED chip GY, the blue LED chip B, and the red LED chip R are preferably collected as close as possible to the center of the main surface of the substrate 51. In particular, in the light emitting device 100, the green LED chip GB is disposed adjacently to the blue LED chip B, and the green LED chip GY is disposed adjacently to the red LED chip R. On the other hand, the distance between one of the green LED chip GB and the blue LED chip B and one of the green LED chip GY and the red LED chip R may be greater than both the distance between the green LED chip GB and the blue LED chip B and the distance between the green LED chip GY and the red LED chip R.

Disposing the green LED chip GB adjacently to the blue LED chip B leads to better mixing of colors of green light and blue light in the light emitting device 100, thereby realizing blue-green light having higher color purity. Moreover, disposing the green LED chip GY adjacently to the red LED chip R leads to better mixing of colors of green light and red light in the light emitting device 100, thereby realizing yellow or yellow-green light having higher color purity.

Next, an outline of the fabrication steps of the light emitting device 100 will be described.

First, one green LED chip GB (dominant wavelength 504 nm), one green LED chip GY (dominant wavelength 538 nm), one blue LED chip B (dominant wavelength 465 nm), and one red LED chip R (dominant wavelength 626 nm) are prepared and each fixed to one of a plurality of chip mount regions of an inner lead part 60 on the main surface side of a substrate 51 with a bonding silicone resin. The bonding silicone resin is cured at 150° C. for 5 hours.

Next, the green LED chip GB is connected to a common inner lead part 62 and one of the chip mount regions of the inner lead part 60 by bonding wires 40. A similar way of connection applies to each of the green LED chip GY, the blue LED chip B, and the red LED chip R. At this time, the common inner lead part 62 serves as a cathode, and each chip mount region of the inner lead part 60 serves as an anode.

Next, a silicone resin is injected into an opening part 80, thereby forming a sealing resin part 50. The injected silicone resin is first cured at 100° C. for 1 hour and is then cured at 150° C. for 5 hours.

Figure 4:
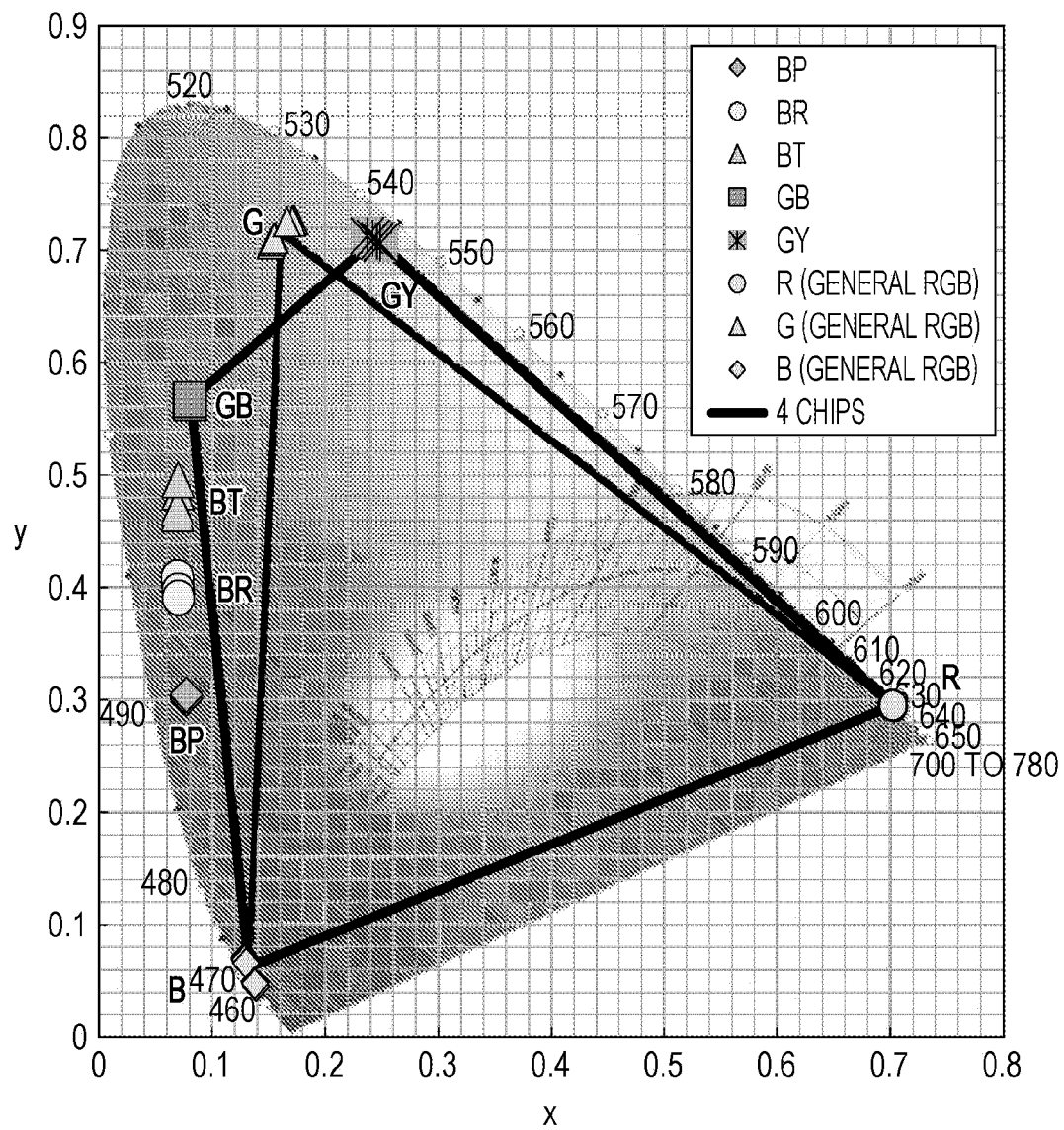
FIG. 4 is a chromaticity diagram illustrating the color reproduction range of light obtained from the light emitting device.

FIG. 4 is a chromaticity diagram illustrating the color reproduction range of light obtained from the light emitting device. The chromaticity diagram shown in FIG. 4 is a general CIE chromaticity diagram in which the chromaticity of light output from each LED chip of the light emitting device is plotted.

A quadrangle whose apexes are a point GB indicating the chromaticity of light emitted from the green LED chip GB, a point GY indicating the chromaticity of light emitted from the green LED chip GY, a point B indicating the chromaticity of light emitted from the blue LED chip B, and a point R indicating the chromaticity of light emitted from the red LED chip R represents the chromaticity range of light which the light emitting device 100 is capable of emitting. A triangle whose apexes are a point G indicating the chromaticity of light emitted from a general green LED chip G, the point B, and the point R represents the chromaticity range of light which a general light emitting device is capable of emitting. It can be seen that the light emitting device 100 has a greater chromaticity range in the blue-green range (around x:0.1, y:0.5) and in the yellow or yellow-green range (around x:0.25, y:0.65) than the chromaticity range of the general light emitting device.

Regarding the xy chromaticity coordinates of the CIE chromaticity diagram, the difference between the x value of the green LED chip GY having the longest dominant wavelength and the x value of each of the other green LED chips (here, only the green LED chip GB) is preferably greater than or equal to 0.06.

In an example of operation of the light emitting device 100, the operating current of each of the blue LED chip B and the red LED chip R may be 20 mA (milliamperes), and the operating current of each of the green LED chip GB and the green LED chip GY may be 10 mA.

The light emitting device 100 may include at least one protection element configured to protect at least one LED chip. Examples of the protection element include printed resistors and Zener diodes.

Second Embodiment

Figure 5:
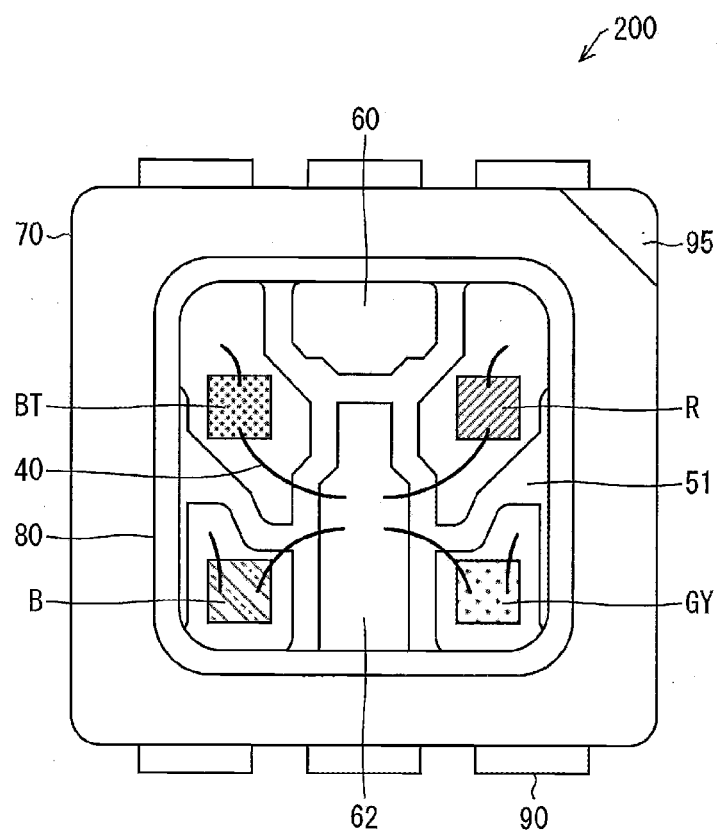
FIG. 5 is a top view illustrating a light emitting device according to a second embodiment of the present invention, wherein a sealing resin part is omitted.

FIG. 5 is a top view illustrating a light emitting device according to the present embodiment, wherein a sealing resin part is omitted. For the sake of easy explanation, members having the same functions as the members described in any one of the above-described embodiments are labeled in the same manner and their explanation is omitted in the descriptions below.

A light emitting device 200 illustrated in FIG. 5 is different from the light emitting device 100 of FIG. 1 in the following points and is substantially the same as the light emitting device 100 of FIG. 1 except for the following points.

That is, the light emitting device 200 does not include the green LED chip GB but includes a green LED chip (first green LED chip) BT instead. Moreover, the position of a green LED chip GY and the position of a red LED chip R in the light emitting device 200 are reverse to those in the light emitting device 100. As a result, the green LED chip BT and the green LED chip GY are arranged diagonally to each other, and a blue LED chip B and the red LED chip R are arranged diagonally to each other.

The dominant wavelength of the green LED chip BT is shorter than the dominant wavelength of the green LED chip GY and is preferably greater than or equal to 480 nm and less than or equal to 520 nm. For example, the dominant wavelength of the green LED chip BT may be 498 nm. In these cases, further, the dominant wavelength of the green LED chip GY having the longest dominant wavelength is longer than the dominant wavelength of each of the other green LED chips (here, only the green LED chip BT) by 20 nm or greater.

The green LED chip BT (having a dominant wavelength of 498 nm) was fixed to one of a plurality of chip mount regions of an inner lead part 60 on the main surface side of a substrate 51 with a bonding silicone resin. The bonding silicone resin was cured at 150° C. for 5 hours.

The green LED chip BT is also connected to a common inner lead part 62 and one of the chip mount regions of the inner lead part 60 with bonding wires 40 in a manner similar to the case of the green LED chip GB.

With reference to FIG. 4, a quadrangle whose apexes are a point BT indicating the chromaticity of light emitted from the green LED chip BT, the point GY, the point B, and the point R represents the chromaticity range of light which the light emitting device 200 is capable of emitting. It can be seen that the light emitting device 200 has a greater chromaticity range in the blue-green range and in the yellow or yellow-green range than chromaticity range of a general light emitting device.

Regarding the xy chromaticity coordinates of the CIE chromaticity diagram, the difference between the x value of the green LED chip GY having the longest dominant wavelength and the x value of each of the other green LED chips (here, only the green LED chip BT) is preferably greater than or equal to 0.06.

Also when the green LED chip BT and the green LED chip GY are arranged diagonally to each other and the blue LED chip B and the red LED chip R are arranged diagonally to each other, a good blue-green color tone and a good yellow or yellow-green color tone are obtained.

The light emitting device 200 may include at least one protection element configured to protect at least one LED chip. Examples of the protection element include printed resistors and Zener diodes.

Third Embodiment

Figure 6:
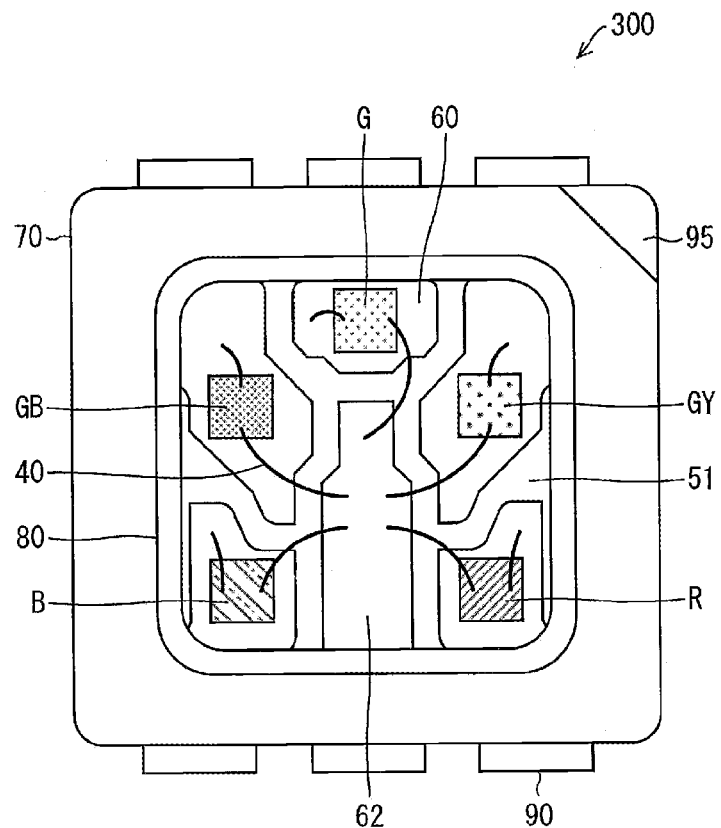
FIG. 6 is a top view illustrating a light emitting device of an ordinary example according to a third embodiment of the present invention, wherein a sealing resin part is omitted.

FIG. 6 is a top view illustrating a light emitting device of an ordinary example according to the present embodiment, wherein a sealing resin part is omitted.

A light emitting device 300 illustrated in FIG. 6 is different from the light emitting device 100 of FIG. 1 in the following points and is substantially the same as the light emitting device 100 of FIG. 1 except for the following points.

That is, the light emitting device 300 further includes a green LED chip G.

The green LED chip G is a green LED chip used in a general light emitting device and has a dominant wavelength of greater than or equal to 520 nm and less than or equal to 530 nm (for example, 525 nm).

The green LED chip G (having a dominant wavelength of 525 nm) was fixed to one of a plurality of chip mount regions of an inner lead part 60 on the main surface side of a substrate 51 with a bonding silicone resin. The bonding silicone resin was cured at 150° C. for 5 hours.

The green LED chip G is also connected to a common inner lead part 62 and one of the chip mount regions of the inner lead part 60 with bonding wires 40 in a manner similar to the case of the green LED chip GB.

Figure 7:
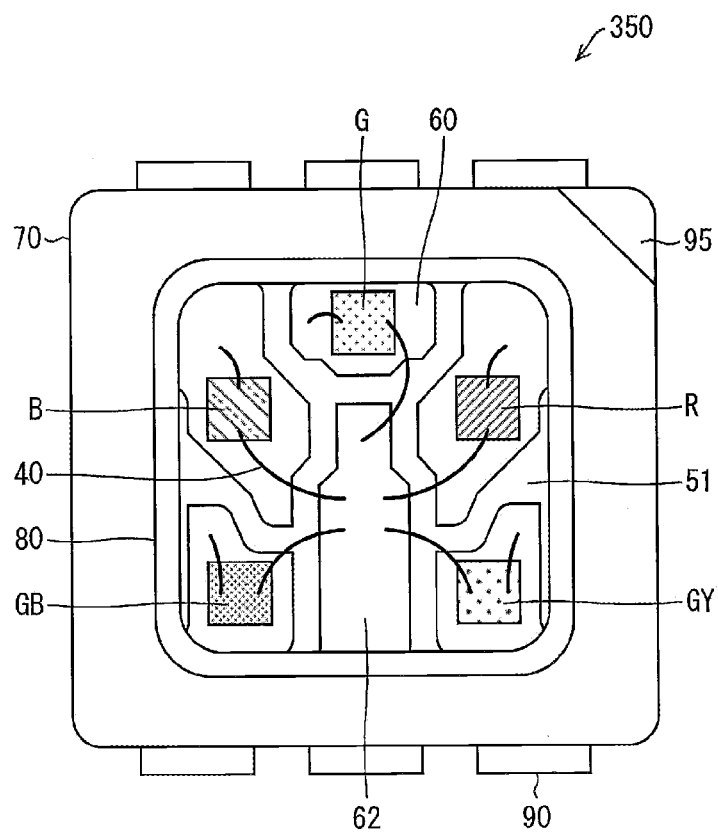
FIG. 7 is a top view illustrating a light emitting device of a variation according to the third embodiment of the present invention, wherein a sealing resin part is omitted.

FIG. 7 is a top view illustrating a light emitting device of a variation according to the present embodiment, wherein a sealing resin part is omitted.

A light emitting device 350 illustrated in FIG. 7 is different from the light emitting device 300 of FIG. 6 in the following points and is substantially the same as the light emitting device 300 of FIG. 6 except for the following points.

That is, the position of a green LED chip GB and the position of a blue LED chip B in the light emitting device 350 are reverse to those in the light emitting device 300, and the position of a green LED chip GY and the position of the red LED chip R are reverse to those in the light emitting device 300.

With reference to FIG. 4, a pentagon whose apexes are the point GB, the point GY, the point B, the point R, and the point G indicating the chromaticity of light emitted from the green LED chip G represents the chromaticity range of light which the light emitting device 300 and the light emitting device 350 is capable of emitting. It can be seen that the light emitting device 300 and the light emitting device 350 each have a greater chromaticity range in the blue-green range and in the yellow or yellow-green range than the chromaticity range of a general light emitting device.

The green LED chip G is further provided, and therefore, the visibility of a color of an object becomes more natural when the object is illuminated. However, when the green LED chip GB, the green LED chip GY, the blue LED chip B, and the red LED chip R are assumed to be one light emitting group, the color purity of light emitted from the green LED chip G is slightly lower than the color purity of light emitted from the group. Therefore, when the green LED chip GB, the green LED chip GY, the blue LED chip B, and the red LED chip R are arranged to form a quadrangle, the green LED chip G is preferably arranged outside the quadrangle as illustrated in FIG. 6 and FIG. 7.

Each of the light emitting device 300 and the light emitting device 350 may include at least one protection element configured to protect at least one LED chip. Examples of the protection element include printed resistors and Zener diodes.

[Performance Example of Each LED Chip]

Table 1 shows the characteristics of the green LED chip GB and the green LED chip GY. In Table 1, "λd" is the dominant wavelength, "CIE_x" is the x value of on the xy chromaticity coordinates of the CIE chromaticity diagram, and "CIE_y" is the y value on the xy chromaticity coordinates.

Table 2 and Table 3 show the characteristics of the LED chips used in the embodiments. In Table 2, "t" of the chip size is the height (unit: μm) of the LED chip. In Table 3, the green LED chip BP and the green LED chip BR are not mentioned in the above-described embodiments, but in FIG. 4, the point BP indicating the chromaticity of light emitted from the green LED chip BP and the point BR indicating the chromaticity of light emitted from the green LED chip BR are shown.

Note that the characteristics shown in Table 1 to Table 3 are mere examples.

TABLE 1

| LED Chip | λd (nm) | CIE_x | CIE_y |
| --- | --- | --- | --- |
| Green LED Chip GB | 504 | 0.081 | 0.567 |
| Green LED Chip GY | 540 | 0.245 | 0.71 |
| Characteristic Difference | 36 | 0.164 | 0.143 |

TABLE 2

| LED Chip | Dominant Wavelength (nm) | Luminous Intensity (mcd) | Chip Size |
| --- | --- | --- | --- |
| Red LED Chip R | 610-630 | 350-450 | 240 μm × 240 μm × 100t |
| Green LED Chip G | 520-530 | 530-770 | 296 μm × 321 μm × 90t |
| Blue LED Chip B | 460-480 | 90-125 | 296 μm × 321 μm × 90t |

TABLE 3

| LED Chip | Dominant Wavelength (nm) |
| --- | --- |
| Green LED Chip BP | 489 |
| Green LED Chip BR | 495 |
| Green LED Chip BT | 498 |
| Green LED Chip GB | 504 |
| Green LED Chip GY | 538 |

Fourth Embodiment

Figure 8:
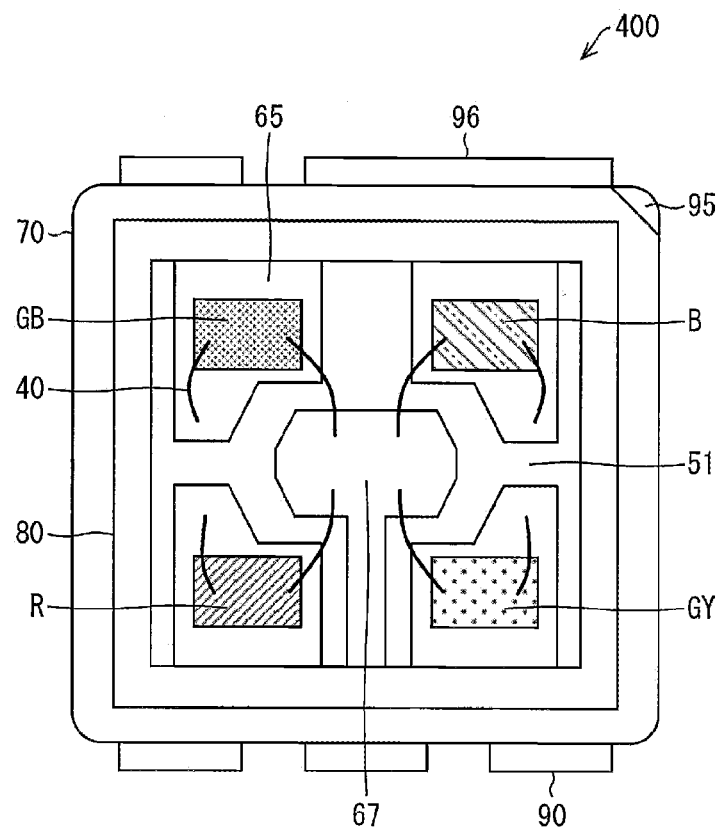
FIG. 8 is a top view illustrating a light emitting device according to a fourth embodiment of the present invention, wherein a sealing resin part is omitted.

FIG. 8 is a top view illustrating a light emitting device according to the present embodiment, wherein a sealing resin part is omitted.

A light emitting device 400 illustrated in FIG. 8 is different from the light emitting device 100 of FIG. 1 in the following points and is substantially the same as the light emitting device 100 of FIG. 1 except for the following points.

That is, the light emitting device 400 includes neither the inner lead part 60 nor the common inner lead part 62 but includes an inner lead part 65 and a common inner lead part 67 instead. Moreover, the number of outer lead parts 90 of the light emitting device 400 is four, i.e., less than the number of the outer lead parts 90 of the light emitting device 100 by two. The light emitting device 400 includes an outer lead part 96 greater in size than the outer lead part 90 on the upper right side in FIG. 8. Moreover, in the light emitting device 400, a blue LED chip B, a green LED chip GY, a red LED chip R, and a green LED chip GB are arranged clockwise in this order.

The common inner lead part 67 has a T-shape. The number of chip mount regions of the inner lead part 60 is five, but the number of chip mount regions of the inner lead part 65 is four. The chip mount region at the upper right region of FIG. 8 is connected to the outer lead part 96.

In the light emitting device 400, the blue LED chip B is connected to the outer lead part 96 in consideration of the heat dissipation of the blue LED chip B. The green LED chip GY is arranged diagonally to the green LED chip GB. With this configuration, high heat dissipation can be realized in the light emitting device 400.

As illustrated in the light emitting device 400, the configurations of the inner lead part, the common inner lead part, and the outer lead are not limited to that illustrated in the light emitting device 100.

The light emitting device 400 may include at least one protection element configured to protect at least one LED chip. Examples of the protection element include printed resistors and Zener diodes.

The number of LED chips included in the LED chip group may be four as, for example, in the light emitting device 100, may be five as, for example, in the light emitting device 300, or may six or greater. In other words, the number of at least one of the green LED chip, the blue LED chip, and the red LED chip may be increased. However, it should be noted that a too large number of LED chips included in the LED chip group leads to high cost.

[Back Surface of Light Emitting Device]

Figure 9:
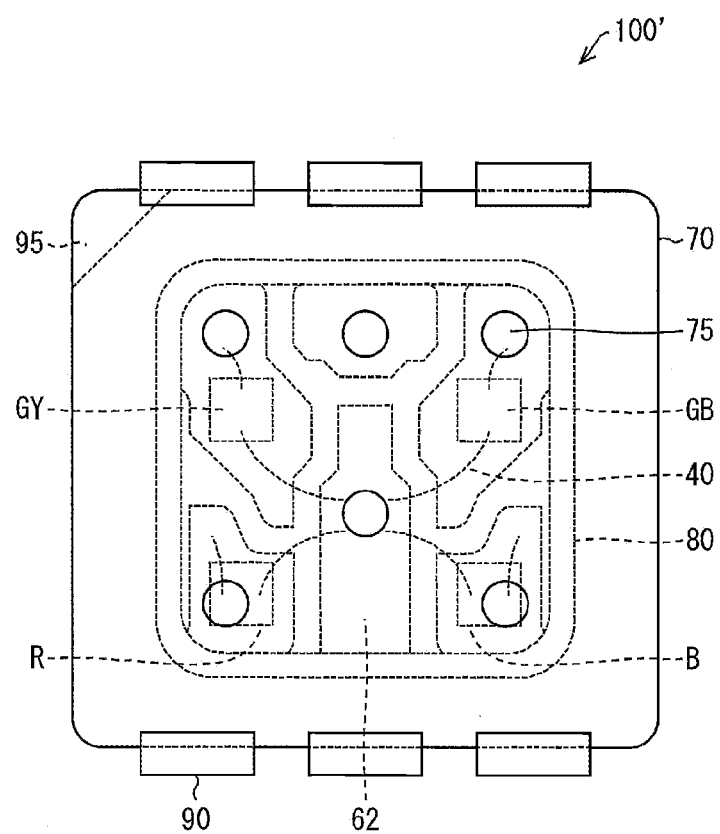
FIG. 9 is a plan view illustrating the back surface of the light emitting device of FIG. 1.

FIG. 9 is a plan view illustrating a back surface 100' of the light emitting device 100 of FIG. 1. For a better understanding of the description, the members which are not visible substantially in FIG. 9 and which are disposed on the main surface of the substrate 51 of FIG. 1 are shown by broken lines.

In order to enhance the purity of a color obtained by mixing colors of light emitted from adjacent LED chips, and also to extend the color reproduction range, the difference in height in the inner lead part 60 has to be reduced by forming through holes 75 in the back surface 100' of the light emitting device 100.

Each of the through holes 75 is provided to one of the chip mount regions of the inner lead part 60, penetrates through a resin reflector 70, and reaches the back surface of the corresponding chip mount region. The through holes 75 are provided to make the upper surface of the inner lead part 60 uniform in height, and to reduce the difference in height in the inner lead part 60.

The light emitting device 100 includes the plurality of LED chips. Therefore, when the upper surface of the inner lead part 60 is uniform in height, it becomes easy to reduce die bond defects. Moreover, the green LED chip GB, the green LED chip GY, the blue LED chip B, and the red LED chip R are commonly wire-bonded to the common inner lead part 62, which can also easily reduce bonding defects. This configuration is favorable when the inner lead part 60 has a plurality of chip mount regions (when the number of wire-bonding positions increases). With this configuration, the purity of a color obtained by mixing colors of light emitted from adjacent LED chips is enhanced in the light emitting device 100, and further, the color reproduction range can be extended.

Of course, the through hole 75 may be formed in the back surface of the light emitting devices 200, 300, 350, 400, 500 (which will be described later), and 600 (which will be described later).

Fifth Embodiment

Figure 10:
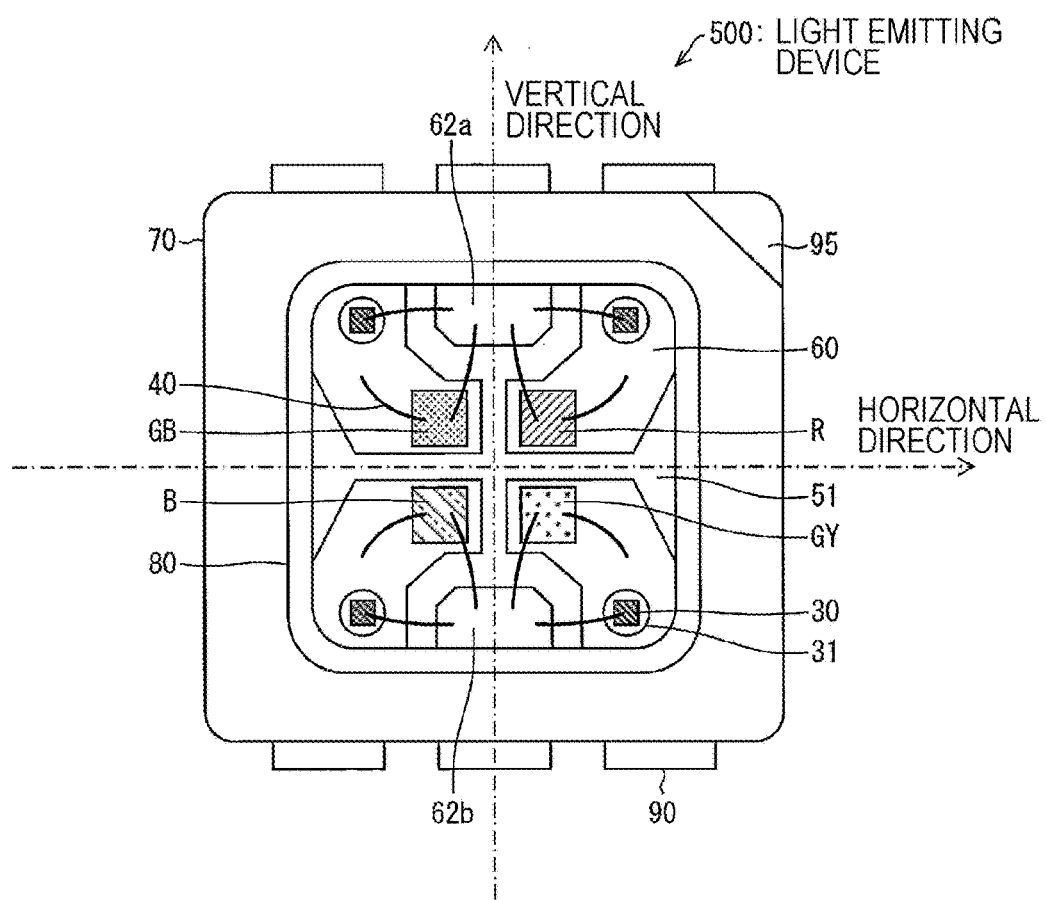
FIG. 10 is a top view illustrating a light emitting device according to a fifth embodiment of the present invention, wherein a sealing resin part is omitted.

FIG. 10 is a top view illustrating a light emitting device according to the present embodiment, wherein a sealing resin part is omitted.

A light emitting device 500 illustrated in FIG. 10 is different from the light emitting device 100 of FIG. 1 in the following points and is substantially the same as the light emitting device 100 of FIG. 1 except for the following points.

That is, the light emitting device 500 does not include the common inner lead part 62 but includes inner lead parts 62a and 62b instead. The inner lead parts 62a and 62b each serve as a cathode in a manner similar to the common inner lead part 62. Moreover, in the light emitting device 500, a red LED chip R, a green LED chip GY, a blue LED chip B, and a green LED chip GB are arranged clockwise in this order. The red LED chip R and the green LED chip GB are connected to the inner lead part 62a via bonding wires 40.

The green LED chip GY and the blue LED chip B are connected to the inner lead part 62b via bonding wires 40.

The red LED chip R, the green LED chip GY, the blue LED chip B, and the green LED chip GB are arranged in proximity to the center of the main surface side of a substrate 51 to be located as close as possible to one another. With this configuration, in the light emitting device 500, the directivity characteristics of the red LED chip R, the directivity characteristics of the green LED chip GY, the directivity characteristics of the blue LED chip B, and the directivity characteristics of the green LED chip GB when seen in the vertical direction and in the horizontal direction as defined in FIG. 10 are matched with one another as much as possible. The directivity characteristics mean the relationship of the light intensity with respect to the emission angle of the light emitting device.

Figure 11:
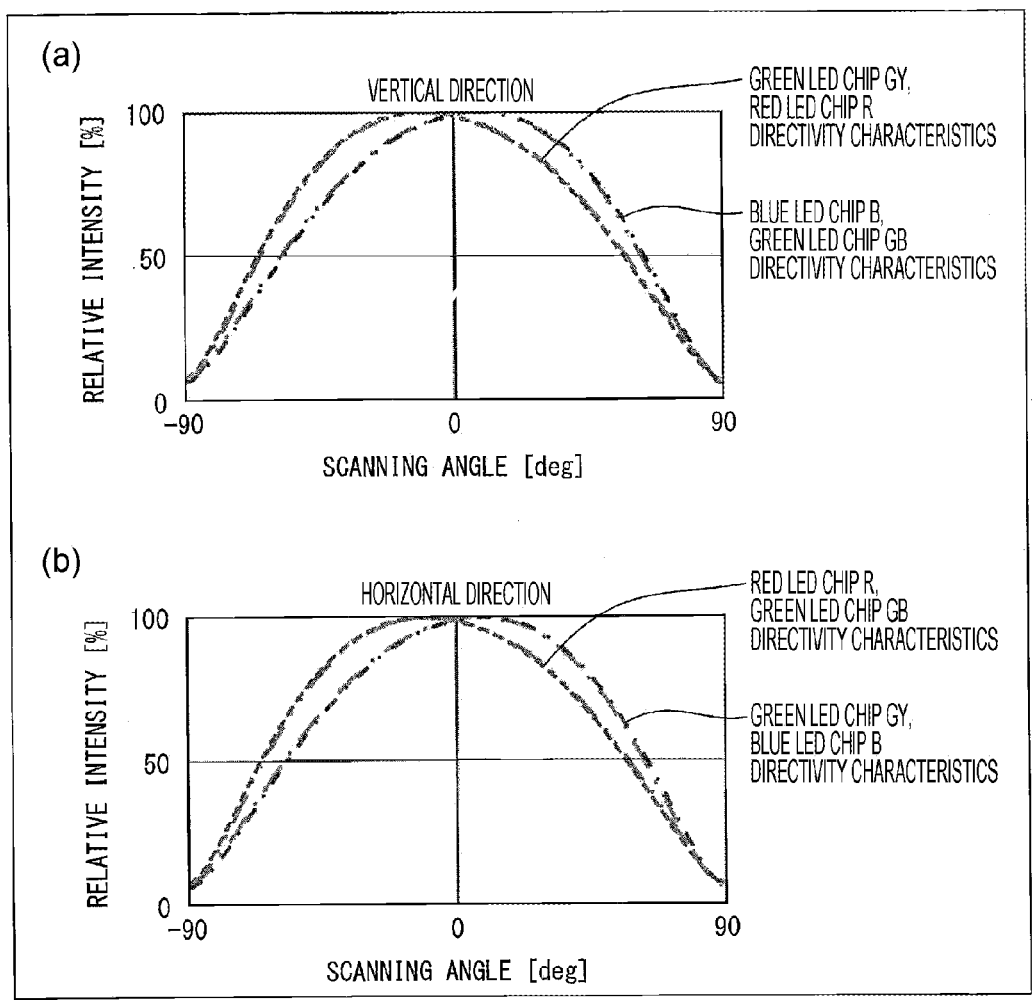
FIG. 11 is a graph illustrating the relationship between the emission angle and the light intensity of the light emitting device shown in FIG. 10, wherein (a) shows characteristics when the light emitting device is seen in the vertical direction, and (b) shows characteristics when the light emitting device is seen in the horizontal direction.

In FIG. 11, (a) is a graph illustrating the relationship between the emission angle and the light intensity of the light emitting device 500 and shows characteristics when the light emitting device 500 is seen in the vertical direction. In FIG. 11, (b) is a graph illustrating the relationship between the emission angle and the light intensity of the light emitting device 500 and shows characteristics when the light emitting device 500 is seen in the horizontal direction.

According to the graph (a) of FIG. 11, in a view in the vertical direction, the directivity characteristics of the green LED chip GY and the directivity characteristics of the red LED chip R substantially match with each other, and the directivity characteristics of the blue LED chip B and the directivity characteristics of the green LED chip GB substantially match with each other.

According to the graph (b) of FIG. 11, in a view in the horizontal direction, the directivity characteristics of the red LED chip R and the directivity characteristics of the green LED chip GB substantially match with each other, and the directivity characteristics of the green LED chip GY and the directivity characteristics of the blue LED chip B substantially match with each other.

Moreover, the light emitting device 500 includes a Zener diode 30 as a protection element provided in each of chip mount regions of an inner lead part 60. Each Zener diode 30 is mounted on one of the chip mount regions of the inner lead part 60 with conductive paste 31. Moreover, each Zener diode 30 is connected to a closer one of the inner lead part 62a and the inner lead part 62b via a bonding wire 40.

Each Zener diode 30 is preferably arranged outside the quadrangle defined by the arrangement of the red LED chip R, the green LED chip GY, the blue LED chip B, and the green LED chip GB to suppress a reduction in luminance of light emitted from the light emitting device 500 due to light absorption of each Zener diode 30.

Sixth Embodiment

Figure 12:
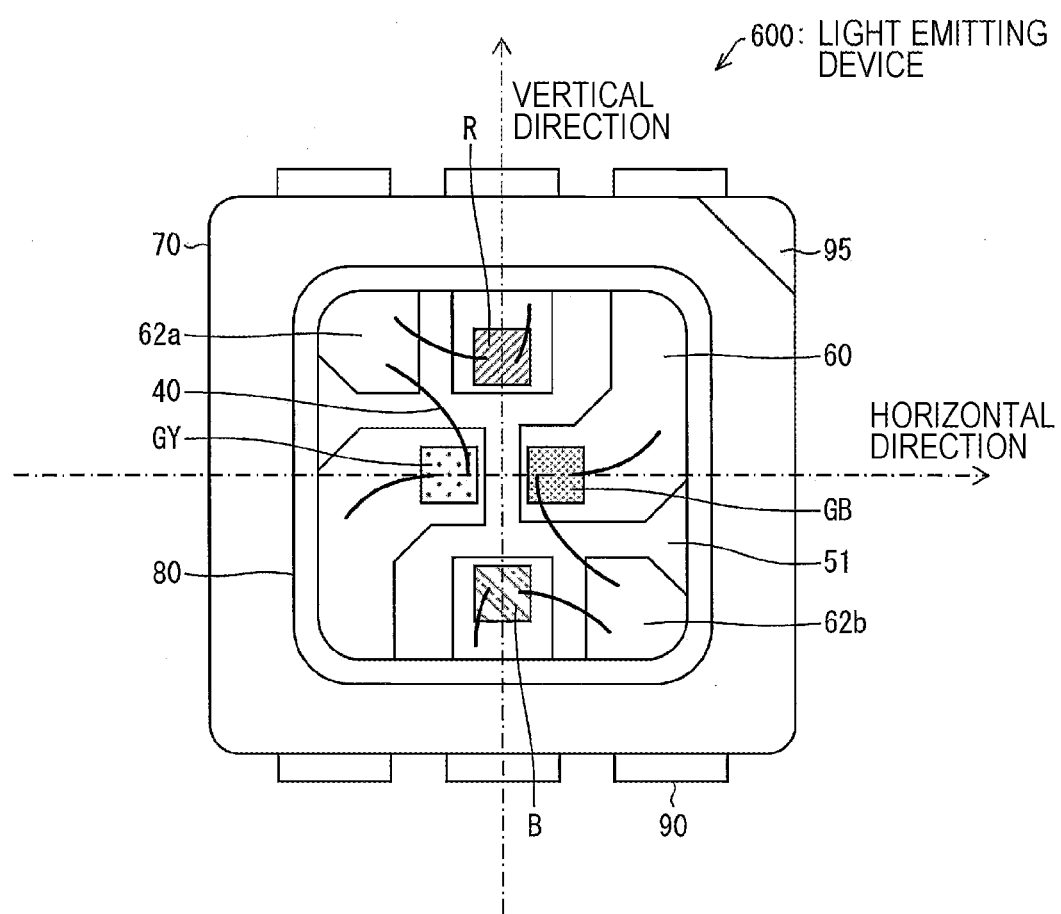
FIG. 12 is a top view illustrating a light emitting device according to a sixth embodiment of the present invention, wherein a sealing resin part is omitted.

FIG. 12 is a top view illustrating a light emitting device according to present embodiment, wherein a sealing resin part is omitted.

A light emitting device 600 illustrated in FIG. 12 is different from the light emitting device 100 of FIG. 1 in the following points and is substantially the same as the light emitting device 100 of FIG. 1 except for the following points.

That is, the light emitting device 600 does not include the common inner lead part 62 but includes inner lead parts 62a and 62b instead. The inner lead parts 62a and 62b each serve as a cathode in a manner similar to the common inner lead part 62. Moreover, in the light emitting device 600, a red LED chip R, a green LED chip GB, a blue LED chip B, and the green LED chip GY are arranged clockwise in this order. The red LED chip R and the green LED chip GY are connected to the inner lead part 62a via bonding wires 40. The green LED chip GB and the blue LED chip B are connected to the inner lead part 62b via bonding wires 40.

The red LED chip R, the green LED chip GY, the blue LED chip B, and the green LED chip GB are arranged in proximity to the center of the main surface side of a substrate 51 to be located as close as possible to one another. With this configuration, in the light emitting device 600, the directivity characteristics of the red LED chip R, the directivity characteristics of the green LED chip GY, the directivity characteristics of the blue LED chip B, and the directivity characteristics of the green LED chip GB when seen in the vertical direction and in the horizontal direction as defined in FIG. 12 are matched with one another as much as possible.

Moreover, in the light emitting device 100, the red LED chip R, the green LED chip GB, the blue LED chip B, and the green LED chip GY are arranged to form a rectangle, but in the light emitting device 600, these chips are arranged to form a diamond shape.

Figure 13:
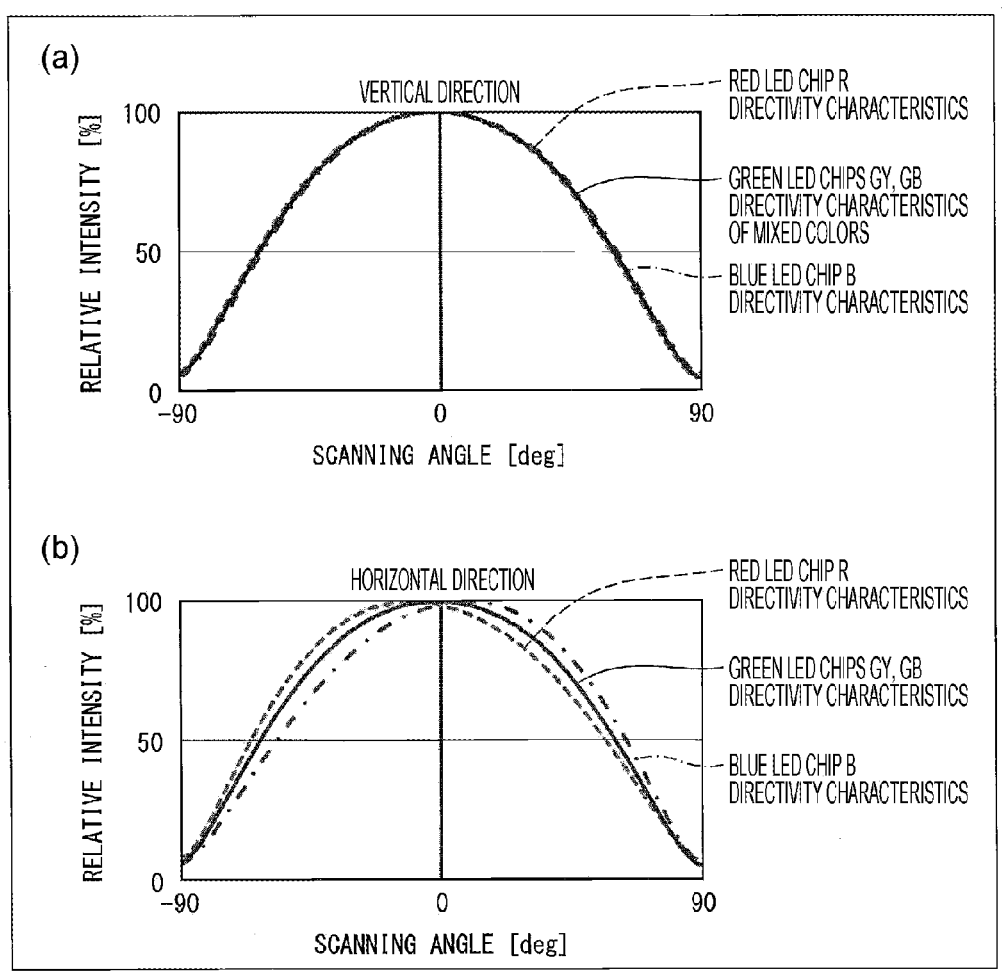
FIG. 13 is a graph illustrating the relationship between the emission angle and the light intensity of the light emitting device shown in FIG. 12, wherein (a) shows characteristics when the light emitting device is seen in the vertical direction, and (b) shows characteristics when the light emitting device is seen in the horizontal direction.

In FIG. 13, (a) is a graph illustrating the relationship between the emission angle and the light intensity of the light emitting device 600 and shows characteristics when the light emitting device 600 is seen in the vertical direction. In FIG. 13, (b) is a graph illustrating the relationship between the emission angle and the light intensity of the light emitting device 600 and shows characteristics when the light emitting device 600 is seen in the horizontal direction.

According to the graph (a) of FIG. 13, in a view in the vertical direction, the directivity characteristics of mixed colors of the green LED chip GY and the green LED chip GB, the directivity characteristics of the red LED chip R, and the directivity characteristics of the blue LED chip B substantially match with one another.

According to the graph (b) of FIG. 13, in a view in the horizontal direction, the directivity characteristics of the green LED chip GY and the directivity characteristics of the green LED chip GB substantially match with each other. Moreover, the directivity characteristics of the blue LED chip B and the directivity characteristics of the red LED chip R are not significantly different from the directivity characteristics of the green LED chip GY and the directivity characteristics of the green LED chip GB.

[Supplementary Information]

The second green LED chip may be used in combination with the yellow LED chip. In this case, there may be a case where the dominant wavelength of the second green LED chip is greater than or equal to 520 nm and less than or equal to 560 nm. That is, when a yellow color LED chip is also used, a conventionally used general green LED chip can be used as the second green LED chip.

SUMMARY

A light emitting device according to one aspect of the present invention is a light emitting device configured to emit at least blue-green light and yellow or yellow-green light, the light emitting device including: a substrate; an LED chip group disposed on a main surface side of the substrate and including a plurality of LED chips; and a sealing part (sealing resin part 50) collectively sealing the LED chip group, wherein the LED chip group includes at least two green LED chips including a first green LED chip (green LED chip GB, green LED chip BT) and a second green LED chip (green LED chip GY), at least one blue LED chip, and at least one red LED chip, and the first green LED chip has a dominant wavelength shorter than a dominant wavelength of the second green LED chip.

With this configuration, the chromaticity range of the blue-green range and the yellow or yellow-green range can be extended, and the color purities of blue-green light and yellow or yellow-green light can be enhanced. As a result, the color reproduction range of light emitted from the light emitting device can be widely extended.

A light emitting device according to another aspect of the present invention, the first green LED chip is disposed adjacently to at least one of the at least one blue LED chip, and the second green LED chip is disposed adjacently to at least one of the at least one red LED chip.

With this configuration, colors of green light and blue light are better mixed, thereby realizing blue-green light having higher color purity. Moreover, with this configuration, colors of green light and red light are better mixed, thereby realizing yellow or yellow-green light having higher color purity.

In a light emitting device according to yet another aspect of the present invention, the dominant wavelength of the first green LED chip is greater than or equal to 480 nm and less than or equal to 520 nm, and the dominant wavelength of the second green LED chip is greater than or equal to 520 nm and less than or equal to 560 nm.

In a light emitting device according to still another aspect of the present invention, a dominant wavelength of one of the green LED chips which has a dominant wavelength which is longest is longer than a dominant wavelength of each of the other green LED chips by 20 nm or greater.

In a light emitting device according to still another aspect of the present invention, regarding xy chromaticity coordinates of a CIE chromaticity diagram, a difference between an x value of one of the green LED chips which has a dominant wavelength which is longest and an x value of each of the other green LED chips is greater than or equal to 0.06.

A light emitting device according to still another aspect of the present invention is a multicolor light emitting device including at least RGB LED chips, the multicolor light emitting device including a first green LED chip, a green LED chip, a yellow LED chip, a blue LED chip, and a red LED chip which are mounted on one package. Moreover, the yellow LED chip preferably has a dominant wavelength of greater than or equal to 580 nm and less than or equal to 610 nm. With this configuration, the color purities of the blue-green light and yellow light can be enhanced, and therefore, a multicolor light emitting device with high color purity can be realized.

Further, mounting the blue LED chip and the first green LED chip adjacently to each other leads to a good blue-green color tone obtained by mixing colors.

A light emitting device according to still another aspect of the present invention is a multicolor light emitting device including at least RGB LED chips, the multicolor light emitting device including a second green LED chip, a green LED chip, a yellow LED chip, a blue LED chip, and a red LED chip which are mounted on one package. Moreover, the yellow LED chip preferably has a dominant wavelength of greater than or equal to 580 nm and less than or equal to 610 nm. With this configuration, the color purities of the yellow-green light and yellow light can be increased, and therefore, a multicolor light emitting device with high color purity can be realized.

Further, mounting the red LED chip and the second green LED chip adjacently to each other leads to a good yellow-green color tone obtained by mixing colors.

Here, in the embodiments of the present invention, a diffusion agent such as particulate silica is mixed in the sealing resin, thereby further increasing the color mixing property of light emitted from a plurality of LED chip.

The present invention is not limited to the embodiments described above. Various modifications can be made within the scope of the claims. Embodiments obtained by accordingly combining the technical means disclosed in the different embodiments are within the technical scope of the present invention. Moreover, combining the technical means disclosed in the embodiments can provide new technical feature.

INDUSTRIAL APPLICABILITY

The present invention can be useful in light emitting devices including LED chips.

REFERENCE SIGNS LIST

50 Sealing Resin Part (Sealing Part)
51 Substrate
100 Light Emitting Device
200 Light Emitting Device
300 Light Emitting Device
350 Light Emitting Device
400 Light Emitting Device
500 Light Emitting Device
600 Light Emitting Device
B Blue LED Chip
BT Green LED Chip (First Green LED Chip)
GB Green LED Chip (First Green LED Chip)
GY Green LED Chip (Second Green LED Chip)
R Red LED Chip

The invention claimed is:
1. A light emitting device configured to emit at least blue-green light and yellow or yellow-green light, the light emitting device comprising:
 a substrate;
 an LED chip group disposed on a main surface side of the substrate and including a plurality of LED chips; and
 a sealing part collectively sealing the LED chip group, wherein
 the LED chip group includes
 at least two green LED chips including a first green LED chip and a second green LED chip,
 at least one blue LED chip, and
 at least one red LED chip,
 the first green LED chip has a dominant wavelength shorter than a dominant wavelength of the second green LED chip,
 the first green LED chip is disposed adjacently to at least one of the at least one blue LED chip,
 the second green LED chip is disposed adjacently to at least one of the at least one red LED chip, and
 when a vertical direction and a horizontal direction orthogonal to each other in a top view of the light emitting device are defined,
 (A) the first green LED chip and the second green LED chip substantially align with each other along a same horizontal direction, and the blue LED chip and the red LED chip substantially align with each other along a same horizontal direction, or

(B) the red LED chip and a first one of the first green LED chip and the second green LED chip substantially align with each other along a same horizontal direction, and a second one of the first green LED chip and the second green LED chip and the blue LED chip substantially align with each other along a same horizontal direction.

2. The light emitting device according to claim 1, wherein the dominant wavelength of the first green LED chip is greater than or equal to 480 nm and less than or equal to 520 nm, and the dominant wavelength of the second green LED chip is greater than or equal to 520 nm and less than or equal to 560 nm.

3. The light emitting device according to claim 1, wherein a dominant wavelength of one of the green LED chips which has a dominant wavelength which is longest is longer than a dominant wavelength of each of the other green LED chips by 20 nm or greater.

4. The light emitting device according to claim 1, wherein regarding xy chromaticity coordinates of a CIE chromaticity diagram, a difference between an x value of one of the green LED chips which has a dominant wavelength which is longest and an x value of each of the other green LED chips is greater than or equal to 0.06.

5. The light emitting device according to claim 1, wherein each LED chip of the LED chip group is independently driven.

* * * * *